(12) United States Patent
Kim et al.

(10) Patent No.: US 7,560,353 B2
(45) Date of Patent: Jul. 14, 2009

(54) METHODS OF FABRICATING MEMORY DEVICES WITH MEMORY CELL TRANSISTORS HAVING GATE SIDEWALL SPACERS WITH DIFFERENT DIELECTRIC PROPERTIES

(75) Inventors: Gyu-chul Kim, Gyeonggi-do (KR); Sung-bong Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 206 days.

(21) Appl. No.: 11/626,495

(22) Filed: Jan. 24, 2007

(65) Prior Publication Data

US 2007/0122970 A1 May 31, 2007

Related U.S. Application Data

(62) Division of application No. 10/911,907, filed on Aug. 5, 2004, now Pat. No. 7,183,662.

(30) Foreign Application Priority Data

Aug. 23, 2003 (KR) .............................. 2003-58507

(51) Int. Cl.
*H01L 21/8239* (2006.01)
(52) U.S. Cl. ............................. 438/303; 257/E21.626
(58) Field of Classification Search ........... 257/E21.626
See application file for complete search history.

(56) References Cited

U.S. PATENT DOCUMENTS

| | | | |
|---|---|---|---|
| 4,717,684 A | 1/1988 | Katto et al. | |
| 5,455,444 A | 10/1995 | Hsue | |
| 5,600,170 A * | 2/1997 | Sugiyama et al. | 257/382 |
| 5,789,298 A | 8/1998 | Gardner et al. | |
| 5,824,588 A | 10/1998 | Liu | |
| 5,925,912 A | 7/1999 | Arai et al. | |
| 5,929,483 A | 7/1999 | Kim et al. | |
| 5,945,710 A | 8/1999 | Oda et al. | |
| 5,955,746 A | 9/1999 | Kim | |
| 6,020,242 A | 2/2000 | Tsai et al. | |
| 6,031,266 A | 2/2000 | Honna | |
| 6,150,266 A | 11/2000 | Lin et al. | |
| 6,232,221 B1 | 5/2001 | Tran et al. | |
| 6,271,564 B1 | 8/2001 | Morihara et al. | |
| 6,350,665 B1 | 2/2002 | Jin et al. | |
| 6,429,083 B1 | 8/2002 | Ishida et al. | |
| 6,451,704 B1 | 9/2002 | Pradeep et al. | |
| 6,545,317 B2 | 4/2003 | Hokazono et al. | |

(Continued)

OTHER PUBLICATIONS

Notice to Submit a Response for Korean Patent Application No. 10-2003-0058507 mailed on Nov. 11, 2005.

*Primary Examiner*—Stephen W Smoot
(74) *Attorney, Agent, or Firm*—Myers Bigel Sibley & Sajovec

(57) ABSTRACT

A memory device, such as a DRAM, SRAM or non-volatile memory device, includes a substrate, a gate electrode disposed on the substrate, and source and drain regions in the substrate adjacent respective first and second sidewalls of the gate electrode. First and second sidewall spacers are disposed on respective ones of the first and second sidewalls of the gate electrode. The first and second sidewall spacers have different dielectric constants. The first and second sidewall spacers may be substantially symmetrical and/or have substantially the same thickness.

17 Claims, 11 Drawing Sheets

U.S. PATENT DOCUMENTS

| | | |
|---|---|---|
| 6,555,868 B2 | 4/2003 | Shimizu et al. |
| 6,642,564 B2 * | 11/2003 | Ogawa et al. ............... 257/296 |
| 6,649,490 B1 | 11/2003 | Lee et al. |
| 6,853,020 B1 | 2/2005 | Yu et al. |
| 2002/0056887 A1 | 5/2002 | Horstmann et al. |
| 2002/0145156 A1 | 10/2002 | Igarashi et al. |
| 2003/0178688 A1 | 9/2003 | Yang et al. |
| 2004/0188806 A1 | 9/2004 | Chung et al. |

* cited by examiner

US 7,560,353 B2

METHODS OF FABRICATING MEMORY DEVICES WITH MEMORY CELL TRANSISTORS HAVING GATE SIDEWALL SPACERS WITH DIFFERENT DIELECTRIC PROPERTIES

RELATED APPLICATION

This application is a divisional of U.S. application Ser. No. 10/911,907, filed Aug. 5, 2004, which corresponds to issued U.S. Pat. No. 7,183,662 and which claims priority to Korean Application No. 2003-58507, filed Aug. 23, 2003, in the Korean Intellectual Property Office. The disclosure of each of the above-referenced applications are hereby incorporated by reference.

BACKGROUND OF THE INVENTION

The present invention relates to integrated circuit devices and methods of fabricating the same, and more particularly to, memory devices and methods of manufacturing the same.

A semiconductor memory device, such as dynamic random access memory (DRAM), static random access memory (SRAM) or non-volatile memory, typically includes a plurality of word lines, a plurality of bit lines, and a plurality of switching elements for switching signals between them. As is well known, a word line is a line used to select the switching element, and a bit line is a line that acts as an external signal line and transfers an external signal to the switching element when the switching element is turned on.

For example, as shown in FIG. 1, a unit cell of a conventional DRAM includes a word line WL, a bit line BL perpendicular to the word line WL, and a MOS transistor Tr. The MOS transistor Tr has a gate connected to the word line WL, a drain (or source) connected to the bit line BL, and a source (or drain) connected to a capacitor C, one terminal of which is connected to a signal ground.

As shown in FIG. 2, a unit cell of a conventional SRAM includes first and second inverters INV1 and INV2 configured as a latch, and access transistors TA1 and TA2 that transfer input signals to the first and second inverters INV1 and INV2. The first access transistor TA1 has a gate connected to a word line WL, a source (or drain) connected to a bit line BL, and a drain (or source) connected to an output terminal S1 of the first inverter INV1. The second access transistor TA2 has a gate connected to the word line WL, a source connected to a bit line bar (complementary bit line) DBL, and a drain connected to an output terminal S2 of the second inverter INV2. Here, a signal having a phase opposite to a bit line (BL) signal is applied to the bit line bar (DBL). In addition, the inverters INV1 and INV2 are configured with pull-up elements (PMOS transistors) and drive transistors (NMOS transistors). In addition to the PMOS transistor, a thin film transistor and a resistor can be used as the pull-up element. The above-described SRAM is described in U.S. Pat. No. 5,654,915.

As shown in FIG. 3, a unit cell of a conventional non-volatile memory device includes a word line WL, a bit line BL perpendicular to the word line WL, and a memory cell M connected between the word line WL and the bit line BL. The memory cell M has a gate connected to the word line WL, a drain connected to the bit line BL, and a source connected to a source electrode line S in common with another memory cell M. Such a non-volatile memory device is described in Japanese Patent Laid-open Publication No. 2000-179840.

Commonly, in such conventional memory devices, a plurality of transistors or memory cells is connected to one word line and one bit line. However, as semiconductor memory devices have become more highly integrated, line widths of the word line and the bit line have generally decreased, which can increase line resistance. Operating speed has also generally increased. As is well known, operating speed is generally a product of resistance R and capacitance C. Because resistance has generally reached a critical minimum value, recent attempts to improve speed have been directed to reducing parasitic capacitance.

Parasitic capacitance typically occurs where lines overlap. In particular, parasitic capacitance of bit lines often significantly influences the operating speed of a semiconductor memory device. The capacitance of a bit line may be viewed at the sum of a capacitance between the bit line and a substrate, a capacitance between the bit line (or a contact plug contacted with the bit line) and a word line, a capacitance between bit lines, and a junction capacitance occurring in a source or drain region of a silicon substrate to which the bit line (or the contact plug contacted with the bit line) is electrically connected. Among them, the parasitic capacitance between the bit line (or the contact plug contacted with the bit line) and the word line contributes to the total bit line loading capacitance.

FIG. 4 is a sectional diagram of a conventional DRAM, showing a word line and a contact plug for connecting to a bit line. Referring to FIG. 4, word line structures 20 are arranged on a semiconductor substrate 10 and spaced apart from each other a predetermined distance. Each of the word line structures 20 has a stacked structure including a gate oxide layer 12, a conductive layer 14 and a hard mask layer 16. Spacers (not shown) are typically formed of the same insulating layer on both sides of the word line structure 20. Source and drain regions 22a and 22b are formed on both sides of the word line structure 20, and contact plugs 25a and 25b are formed between the word line structures 20, in contact with respective ones of the source and drain regions 22a and 22b.

A parasitic capacitance occurs in regions 30 and 31 in which the word line structures, especially the conductive layers 14, overlap the contact plugs 25a and 25b. This capacitance (hereinafter, referred to as a first capacitance) between the contact plug 25a and the word line structure 20 can increase a data storage capacitance, which can increase the cell stability. A subsequently formed storage node electrode contacts the contact plug 25a. The capacitance (hereinafter, referred to as a second capacitance) between the contact plug 25b and the word line structure 20 acts as a bit line loading capacitance, which can lower the speed characteristic of the cell. A subsequently formed bit line contacts the contact plug 25b.

Generally, it is desirable for the first capacitance between the contact plug 25a and the word line structure 20 to be increased and for the second capacitance between the contact plug 25b and the word line structure 20 to be decreased. However, the first and second capacitances typically are substantially the same, because the conductive layers 14 of the word line structure 20 are formed with a uniform thickness and the spacers are also formed with a uniform thickness. Thus, it may be difficult to decrease the second capacitance while increasing the first capacitance in a conventional configuration.

SUMMARY OF THE INVENTION

According to some embodiments of the present invention, a memory device, such as a DRAM, SRAM or non-volatile memory device, includes a substrate, a gate electrode disposed on the substrate, and source and drain regions in the substrate adjacent respective first and second sidewalls of the gate electrode. First and second sidewall spacers are disposed on respective ones of the first and second sidewalls of the gate electrode. The first and second sidewall spacers have different dielectric properties, e.g., different dielectric constants. The first and second sidewall spacers may be substantially symmetrical and/or have substantially the same thickness.

In some embodiments of the present invention, the drain region is electrically coupled to a bit line, and the second sidewall spacer has a lower dielectric constant than the first sidewall spacer. For example, an interlayer dielectric layer may be disposed on the gate electrode and the drain region, and a bit line contact plug may extend through the interlayer dielectric layer to contact the drain region. The second sidewall spacer may be disposed between the bit line contact plug and the gate electrode. The source region may be electrically coupled to a charge storage node, and the first sidewall spacer may have a higher dielectric constant than the second sidewall spacer. For example, a charge storage node contact plug may extend through an interlayer dielectric layer to contact the source region, and the first sidewall spacer may be disposed between the charge storage node contact plug and the gate electrode.

According to further embodiments of the present invention, an etch stopper separates the first and second sidewall spacers from the respective first and second sidewalls of the gate electrode. The etch stopper may include a silicon oxide layer conforming to the first and second sidewalls, to a top surface of the gate electrode and to surfaces of the substrate adjacent the gate electrode, and first and second silicon nitride layers on the silicon oxide layer, respective ones of which conform to the silicon oxide layer on the first and second sidewalls and the adjacent surfaces of the substrate.

In some embodiments of the present invention, a DRAM includes a semiconductor substrate, a word line gate structure on the substrate and source and drain regions disposed in the substrate on respective sides of the word line gate structure. A first spacer is disposed on sidewall of the word line gate structure adjacent the source region. A second spacer is disposed on a sidewall of the word line gate structure adjacent the drain region, the second spacer having a lower dielectric constant than the first spacer. A bit line contact plug contacts the drain region adjacent the second spacer. A storage node contact plug contacts the source region adjacent the first spacer.

In further embodiments of the present invention, an SRAM includes a semiconductor substrate, and an access transistor including a gate electrode on the substrate and source and drain regions disposed in the substrate on respective sides of the gate electrode. A first spacer is disposed on a first sidewall of the gate electrode adjacent the drain region. A second spacer is disposed on a second sidewall of the gate electrode adjacent the source region, the second spacer having a lower dielectric constant than the first spacer. A bit line contact plug is disposed on the substrate, in contact with the source region of the access transistor.

In additional embodiments, a non-volatile memory device includes a semiconductor substrate, a gate structure including a tunnel oxide layer, a floating gate, an inter-gate dielectric layer and a control gate on the substrate, and source and drain regions disposed in the substrate on respective sides of the gate structure. A first spacer is disposed on a first sidewall of the gate structure adjacent the source region, and a second spacer disposed on a second sidewall of the gate structure adjacent the drain region. A bit line contact plug is disposed on the substrate and in contact with the drain region. The second spacer has a lower dielectric constant than the first spacer.

In some method embodiments of the present invention, a memory device is fabricated by forming a gate electrode on a substrate and forming first and second sidewall spacers on first and second sidewalls of the gate electrode, the first and second sidewall spacers having different dielectric properties. Source and drain regions are formed in the substrate adjacent the respective first and second sidewalls of the gate electrode. A bit line contact plug may be formed on the drain region, and the second sidewall spacer may have a lower dielectric constant than the first sidewall spacer. A charge storage node electrode may be formed on the source region, and the first sidewall spacer may have a higher dielectric constant than the second sidewall spacer.

In further method embodiments, a word line gate structure is formed on a semiconductor substrate. First spacers are formed on respective sidewalls of the word line gate structure. One of the first spacers is removed from one of the sidewalls, and a second spacer is formed on the one of the sidewalls from which the first spacer was removed, the second spacer having a different dielectric constant than the first spacer. Source and drain regions are formed in the substrate on respective sides of the word line gate structure.

In still further embodiments of the present invention, a word line gate structure is formed on a semiconductor substrate. An etch stopper is formed on the semiconductor substrate and on the word line gate structure. First spacers are formed on respective first and second sidewalls of the word line gate structure. One of the first spacers is removed from one of the sidewalls, and a second spacer is formed on the one of the sidewalls from which the first spacer was removed, the second spacer having a different dielectric constant than the first spacer. Source and drain regions are formed in the substrate adjacent the respective first and second spacers. An interlayer insulating layer is formed on the semiconductor substrate, and a bit line contact plug is formed extending through the interlayer insulating layer to contact one of the source region or the drain region.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
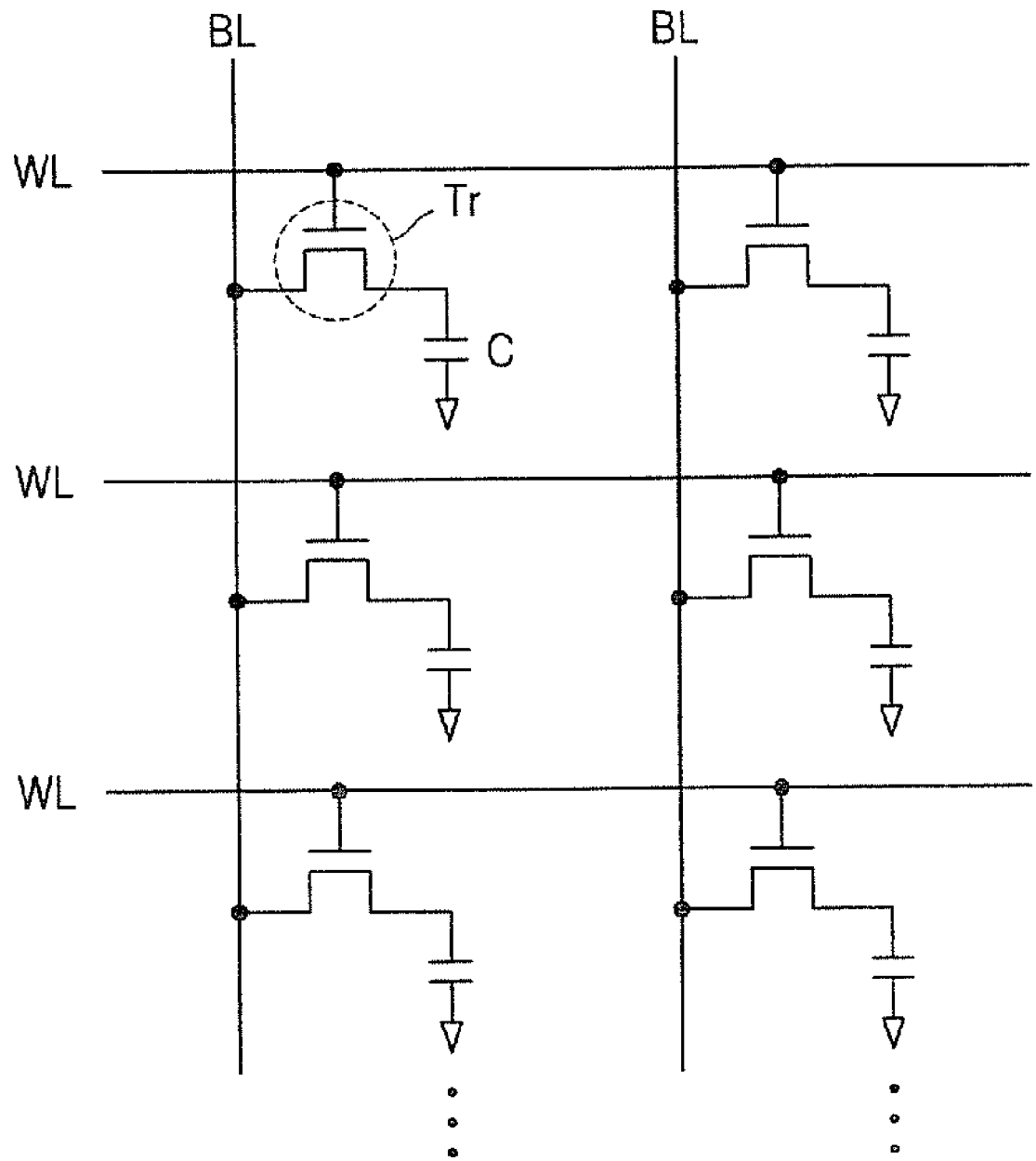
FIG. 1 is a schematic circuit diagram of a conventional DRAM.

The present invention now will be described more fully hereinafter with reference to the accompanying drawings, in which typical and exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the thickness of layers and regions are exaggerated for clarity. It will be understood that when an element such as a layer or region is referred to as being "on" another element, it can be directly on the other element or intervening elements may also be present. Furthermore, relative terms, such as "beneath," may be used herein to describe one element's relationship to another elements as illustrated in the drawings. It will be understood that relative terms are intended to encompass different orientations of a structure in addition to the orientation depicted in the drawings. For example, if the structure in the drawings is turned over, elements described as "below" other elements would then be oriented "above" the other elements. The exemplary term "below," therefore, encompasses both an orientation of above and below.

It will be understood that although the terms "first" and "second" are used herein to describe various regions, layers and/or components, these regions, layers and/or components should not be limited by these terms. These terms are only used to distinguish one region, layer or section from another region, layer or section. Thus, a first region, layer or section discussed below could be termed a second region, layer or section, without departing from the teachings of the present invention. As used herein the term "and/or" includes any and all combinations of one or more of the associated listed items. Like numbers refer to like elements throughout.

Exemplary embodiments described herein include semiconductor regions in substrates defined as "source" and "drain" regions. It will be appreciated that such source and drain regions may be substantially similar regions. For example, in a metal oxide semiconductor (MOS) transistor, substantially similar diffusion regions may be formed on respective sides of gate electrode. Although these diffusion regions may be substantially similar in configuration and composition, they may be referred to as, respectively, a "source" and a "drain" depending the manner in which the regions are connected within a circuit including the MOS transistor.

Figure 5:
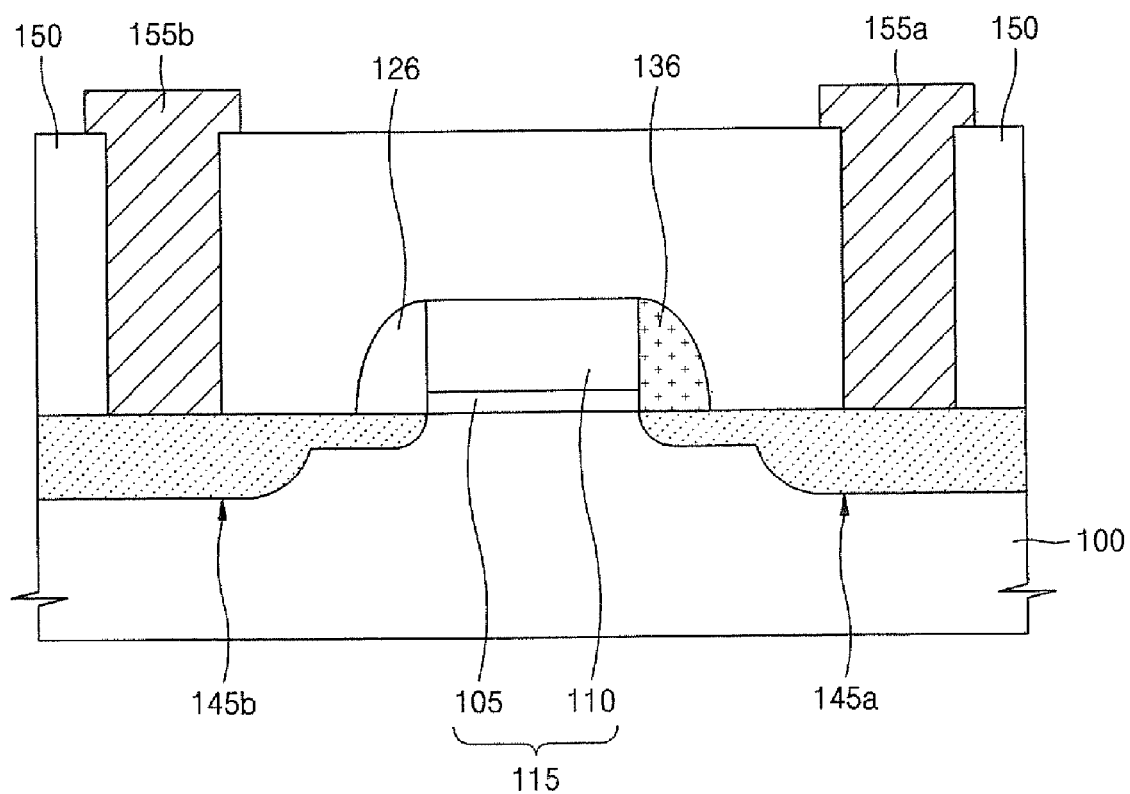
FIG. 5 is a cross-sectional view of a semiconductor memory device according some embodiments of the present invention.

Referring to FIG. 5, a word line gate stricture 115, including a gate oxide layer 105 and a conductive layer 110, is formed on a semiconductor substrate 100. Source and drain regions 145a and 145b having a lightly doped drain (LDD) structure are formed. The drain region 145b is configured to be contacted with a subsequently formed signal line, for example, a bit line. Another signal line may be subsequently formed to contact the drain region 145b.

A first spacer 126 is formed between the word line gate structure 115 and the drain region 145b, and a second spacer 136 is formed between the word line gate structure 115 and the source region 145a. The first spacer 126 includes an insulating layer having a lower dielectric constant than the second spacer 136. For example, the first spacer 126 can be formed of a silicon oxide layer and the second spacer 136 can be formed of a silicon nitride layer or an undoped polysilicon layer. The first and second spacers 126 and 136 are symmetrical and have the same thickness.

An interlayer insulating layer 150 is formed on the resultant structure, and first and second contact plugs 155a and 155b are formed inside the interlayer insulating layer 150. For example, the first and second contact plugs 155a and 155b may contact the source and drain regions 145a and 145b, respectively. The second contact plug 155b may be, for example a bit line contact plug.

Figure 6A:
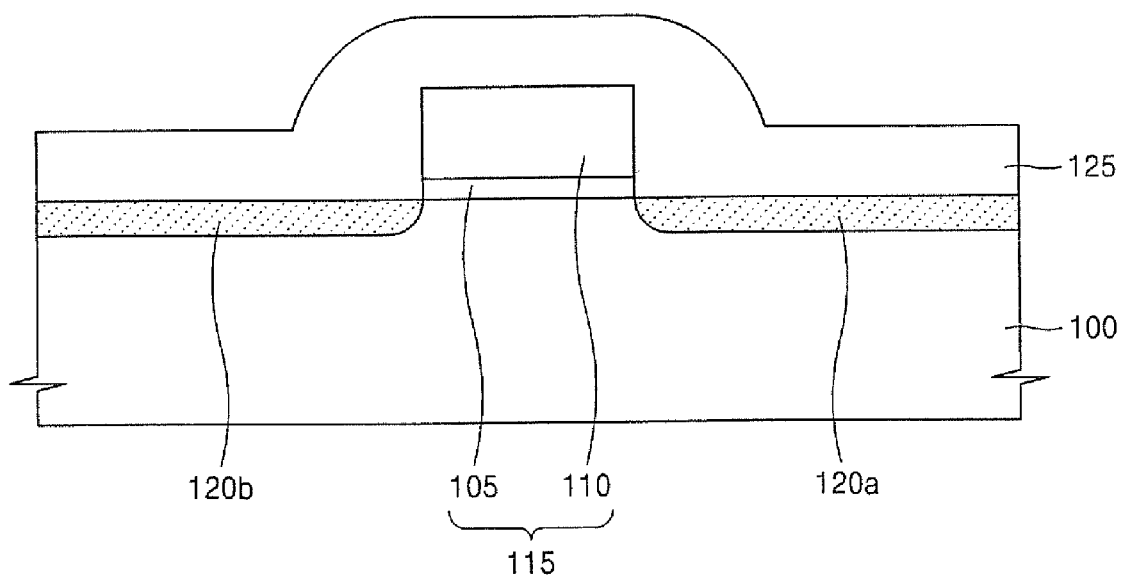
FIGS. 6A through 6D are cross-sectional view of intermediate fabrication products illustrating exemplary operations for fabricating a memory device according to further embodiments of the present invention.

Referring to FIG. 6A, to form the structure of FIG. 5, a gate oxide layer 105 and a conductive layer 110 are sequentially formed on a semiconductor substrate 100. The conductive layer 110 may be a doped polysilicon layer, a metal silicide layer, a transition metal layer, or a stacked layer thereof. The conductive layer 110 and the gate oxide layer 105 are patterned to form a word line gate structure 115. Low-concentration impurities with conductivity type opposite to the substrate 100 are implanted into the semiconductor substrate 100 on both sides of the word line gate structure 115, thereby forming low-concentration impurity regions 120a and 120b. A first layer 125 for the spacer is conformally deposited on the semiconductor substrate 100 on which the word line gate structure 115 is formed. The first layer 125 may be, for example, a silicon oxide layer.

Figure 6B:
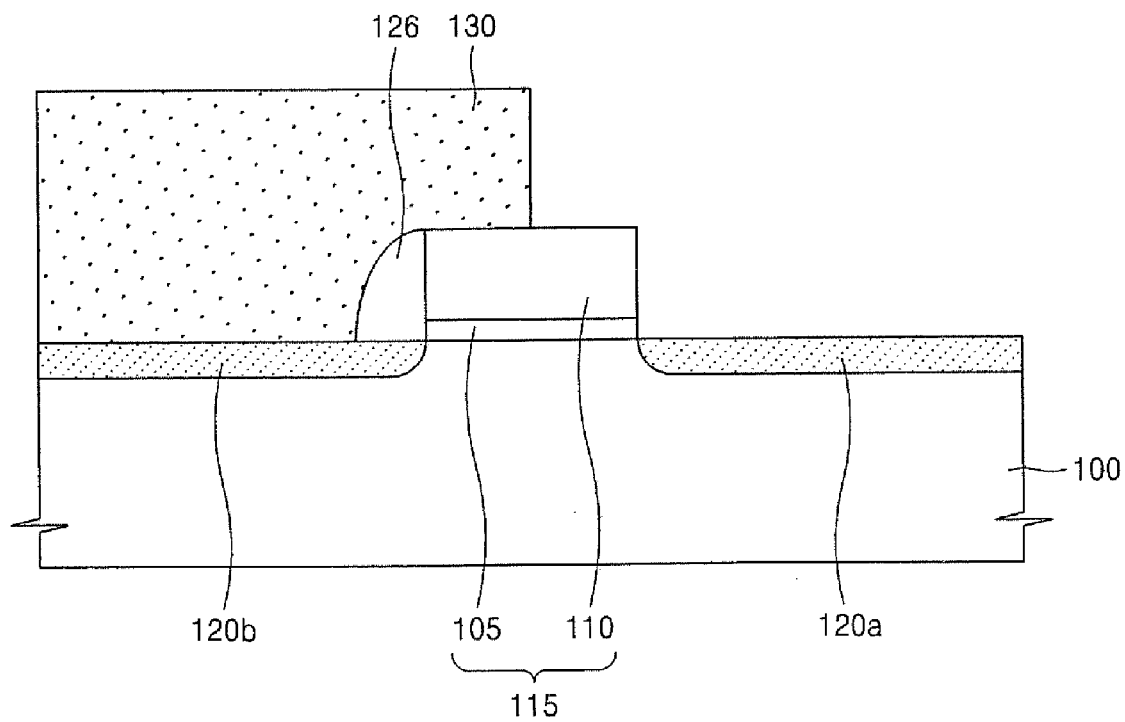

Referring to FIG. 6B, an anisotropic etching process is performed on the first layer 125 using, for example, a mixture of $CF_4$, $O_2$ and Ar gases or a mixture of $CHF_3$, $O_2$ and Ar gasses, to expose a surface of the word line gate structure 115, such that first spacers 126 are formed on both sidewalls of the word line gate structure 115. Then, a photoresist pattern 130 is formed to shield the spacer 126 disposed near the point where a contact plug will be formed. Preferably, the photoresist pattern 130 is formed to shield the first spacer 126 disposed in the region where the drain region will be formed and to expose the first spacer 126 disposed in the region where the source region will be formed. The exposed first spacer 126 is removed using the photoresist pattern 130 as a mask.

Figure 6C:
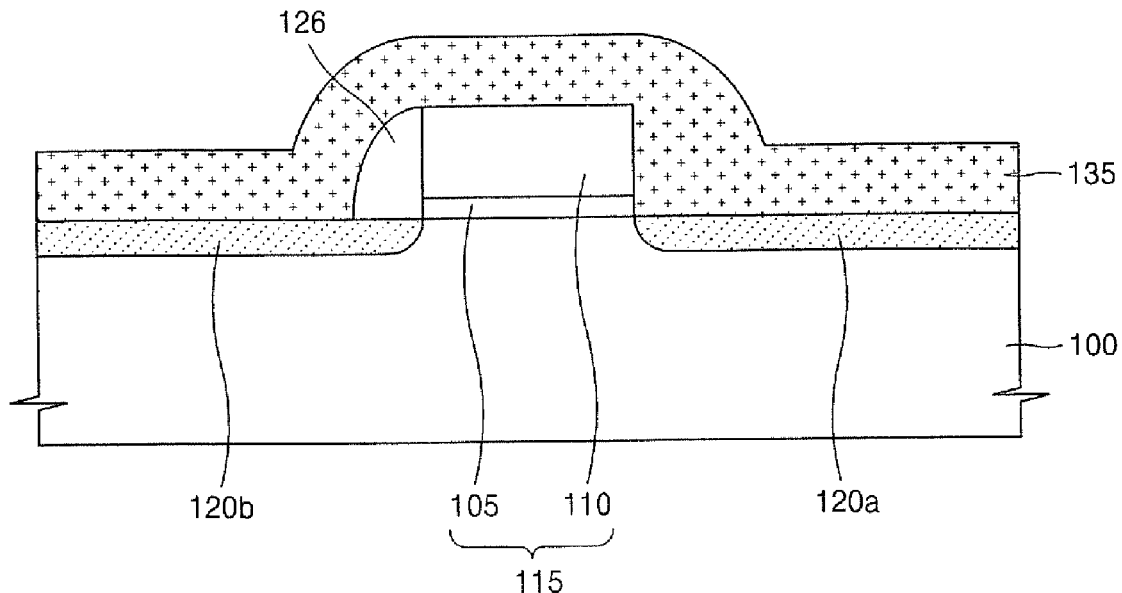

Referring to FIG. 6C, the photoresist pattern 130 is then removed and a second layer 135 is deposited on the resultant structure. The second layer 135 can be formed, for example, as a silicon nitride layer or an undoped polysilicon layer, which has a higher dielectric constant than the first layer 125. Preferably, the second layer 135 is deposited with the same thickness as the first layer 125.

Figure 6D:
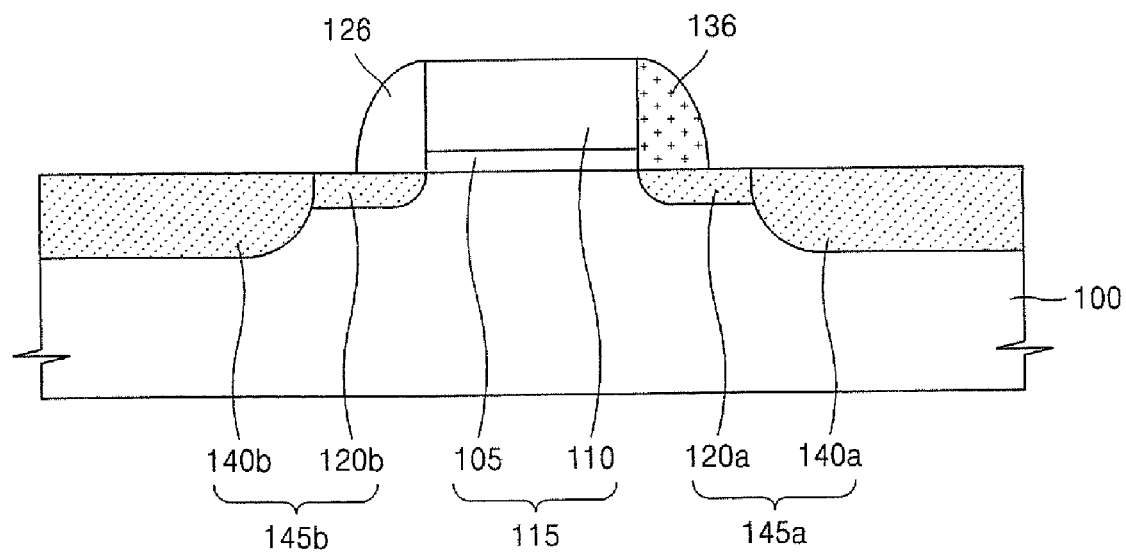

Referring to FIG. 6D, an anisotropic etching process is performed on the second layer 135 using, for example, a mixture of $CF_4$, $O_2$ and Ar gases or a mixture of $CHF_3$, $O_2$ and Ar gases, to expose a surface of the word line gate structure 115, such that second spacer 136 is formed. The second spacer 136 is formed on a sidewall of the word line gate structure 115 disposed in the region where the first spacer is removed, that is, where the source region will be formed. In this manner, the spacers 126 and 136 having different dielectric constants are formed on respective sidewalls of the word line gate structure 115. High-concentration impurity ions are implanted into the semiconductor substrate disposed on both sides of the word line gate structure 115, such that high-concentration impurity regions 140a and 140b are formed. A MOS transistor with LDD-type source and drain regions 145a and 145b is thereby formed.

Referring again to FIG. 5, an interlayer insulating layer 150 is deposited on the semiconductor substrate 100 where the MOS transistor is formed. The interlayer insulating layer 150 is etched to form contact holes that expose the source and drain regions 145a and 145b. A conductive layer is deposited on the interlayer insulating layer 150 to fill the contact holes, and then the conductive layer is patterned to form first and second contact plugs 155a and 155b. The second contact plug 155b is a bit line contact plug.

In the illustrated embodiments of FIGS. 5 and 6A-D, the sidewall spacer adjacent to the bit line contact plug has a relatively lower dielectric constant than the spacer formed on the other sidewall. Accordingly, a parasitic capacitance between the bit line and the word line can be decreased such that a bit line loading capacitance can be reduced. In these embodiments, the first spacer 126 and the second spacer 136 are formed in sequence. However, it will be understood that substantially the same structure can be obtained by forming the spacers in reverse order.

Figure 7:
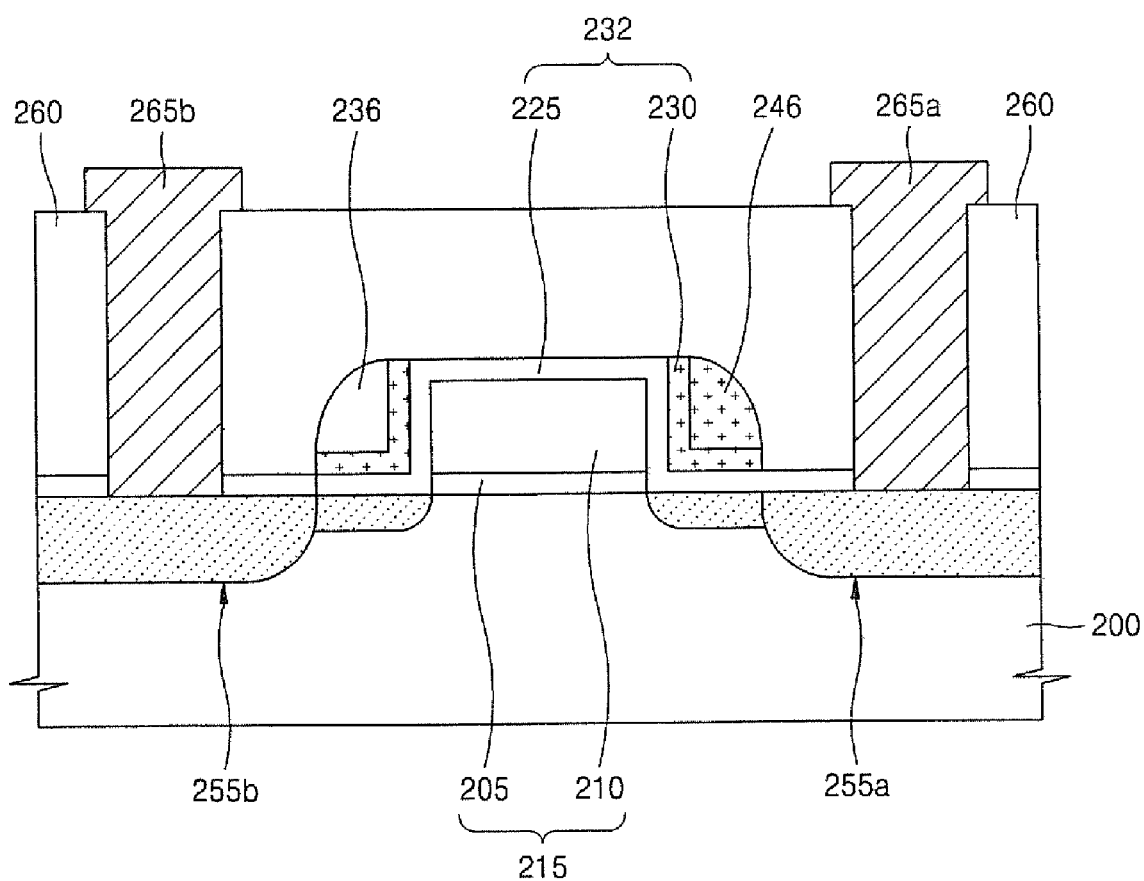
FIG. 7 is a cross-sectional view of a memory device according to additional embodiments of the present invention.

FIG. 7 is a sectional diagram of a semiconductor memory device according to further embodiments of the present invention, and FIGS. 8A through 8E illustrate exemplary operations for fabricating the device of FIG. 7. Referring to FIG. 7, a word line gate structure 215, including a gate oxide layer 205 and a conductive layer 210, is formed on a semiconductor substrate 200. LDD-type source and drain regions 255a and 255b are formed on the semiconductor substrate 200 on respective sides of the word line gate structure 215. In this embodiment, it is assumed that a signal line (e.g. bit line) contact plug will be formed to contact the drain region 255b.

A first spacer 236 is formed between the word line gate structure 215 and the drain region 255b and a second spacer 246 is formed between the word line gate structure 215 and the source region 255a. The first spacer 236 includes an insulating layer having a lower dielectric constant than the second spacer 246. For example, the first spacer may include a silicon oxide layer and the second spacer 246 may include a silicon nitride layer and/or an undoped polysilicon layer. Further, the first and second spacers 236 and 246 may be symmetrical in shape, with the same thickness.

An etch stopper 232 is interposed between each spacer 236 and 246 and the word line gate structure 215. The etch stopper 232 includes a stacked combination of a silicon oxide layer 225 and a silicon nitride layer 230. The silicon oxide layer 225 covers a surface of the semiconductor substrate 200 adjacent the word line gate structure 215, and sidewalls and an upper surface of the word line gate structure 215. The silicon nitride layer 230 is interposed between each spacer 236 and 246 and the semiconductor substrate 200 and between each spacer 236 and 246 and the word line gate structure 215. The etch stopper 232 can protect the gate oxide layer 205 and the semiconductor substrate 200.

An interlayer insulating layer 260 is formed on the resultant structure. First and second contact plugs 265a and 265b are formed in contact holes in the interlayer insulating layer 250, contacting respective ones of the source region 255a and the drain region 255b. The second contact plug 265b may be, for example, a bit line contact plug.

Figure 8A:
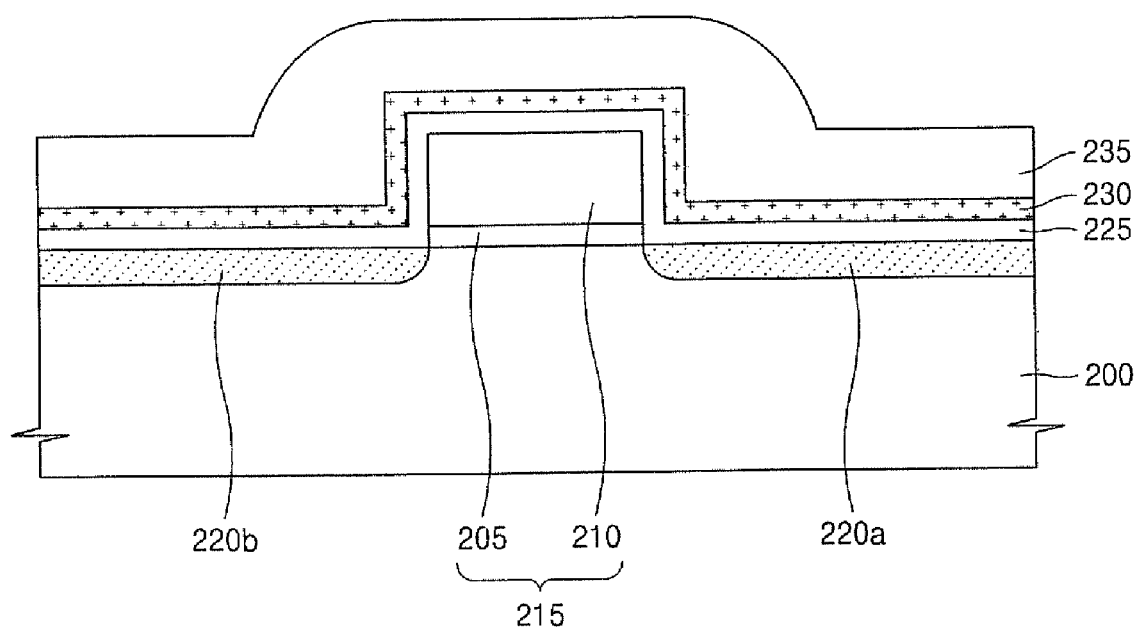
FIGS. 8A through 8E are cross-sectional views of intermediated fabrication products illustrating exemplary operations for fabricating a memory device according to further embodiments of the present invention.

Referring to FIG. 8A, to form the structure of FIG. 7, a gate oxide layer 205 and a conductive layer 210 are sequentially formed on a semiconductor substrate 200. The conductive layer 210 may include a doped polysilicon layer, a metal silicide layer, a transition metal layer, or a combination thereof. The conductive layer 210 and/or the gate oxide layer 205 are patterned to form a word line gate structure 215. Impurities with a conductivity type opposite that of the substrate 200 are implanted at a low concentration into the semiconductor substrate 200 on respective sides of the word line gate structure 215, thereby forming low-concentration impurity regions 220a and 220b. A silicon oxide layer 225 and a silicon nitride layer 230 are then sequentially deposited on the semiconductor substrate 200 where the word line gate structure 215 is formed. The silicon oxide layer 225 is formed to a thickness of about 100 Å to about 300 Å. The silicon nitride layer 230 is formed to a thickness of about 100 Å to about 300 Å. A first layer 235 for the spacer is deposited on the silicon nitride layer 230. The first layer 235 may include an insulating layer having a low dielectric constant, for example, a silicon oxide layer. The first layer 235 may be formed to a thickness of about 500 Å to 1500 Å.

Figure 8B:
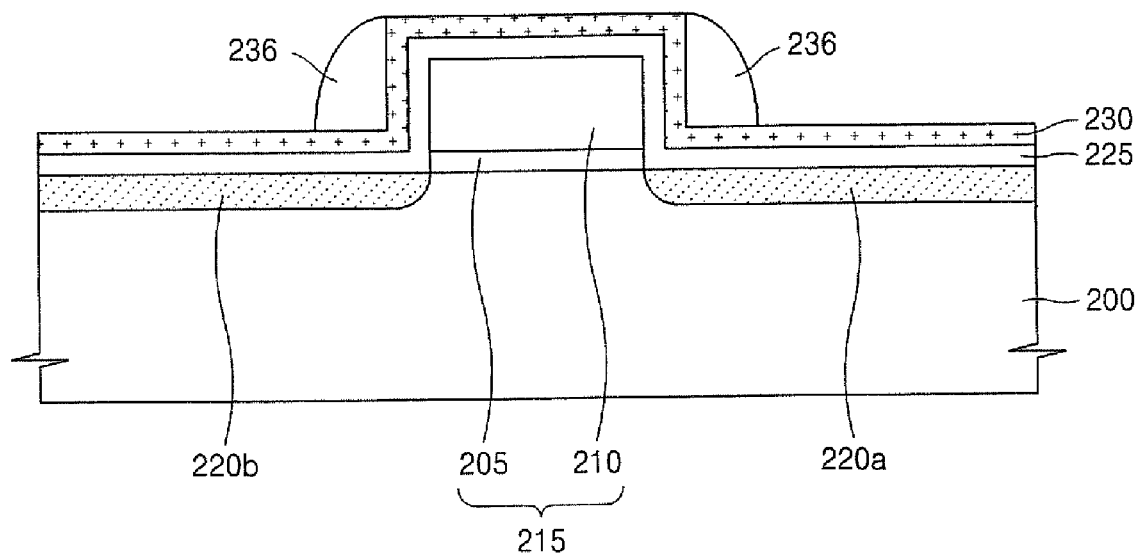

Referring to FIG. 8B, an anisotropic etching process is performed using, for example, a mixture of $CF_4$, $O_2$ and Ar gases and/or a mixture of $CHF_3$, $O_2$ and Ar gases, to expose a surface of the silicon nitride layer 230, and such that first spacers 236 are formed on respective sidewalls of the word line gate structure 215. For example, an anisotropic etching process may be performed on the first layer 235 (the silicon oxide layer) and the silicon nitride layer 230 with an etching selectivity of 3:1 to 5:1. Accordingly, the nitride layer 230 remains while the first layer 235 is etched away, thereby preventing damage to the lower silicon oxide layer 225.

Figure 8C:
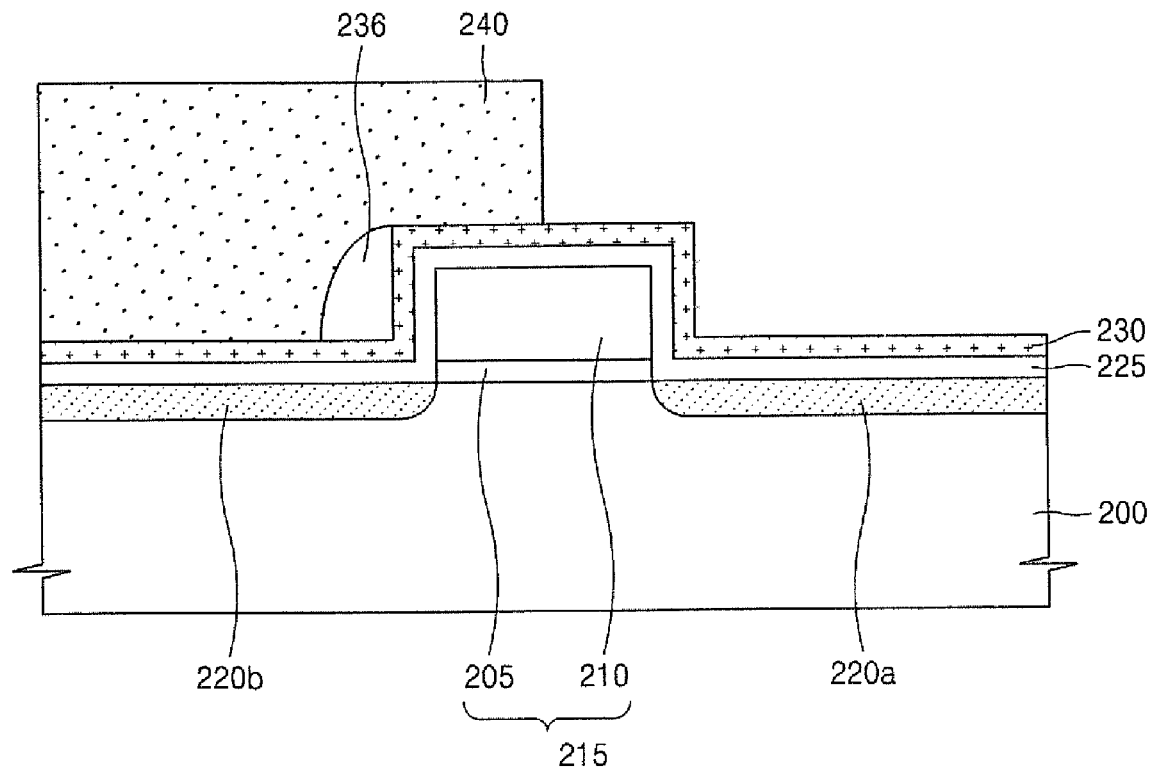

Referring to FIG. 8C, a photoresist pattern 240 is then formed to cover the first spacer 236 and the low-concentration impurity layer 220b while leaving the low-concentration impurity region 220a (which will be the source region) and the first spacer 236 adjacent thereto exposed. The exposed first spacer 236 is then removed through a selective wet or dry etching process using HF solution. Because the gate oxide layer 205 and the surface of the semiconductor substrate 200 are shielded by the etch stopper 232, it is possible to prevent both a loss of the gate oxide layer 205 and damage to the semiconductor substrate 200 when removing the first spacer 236.

Figure 8D:
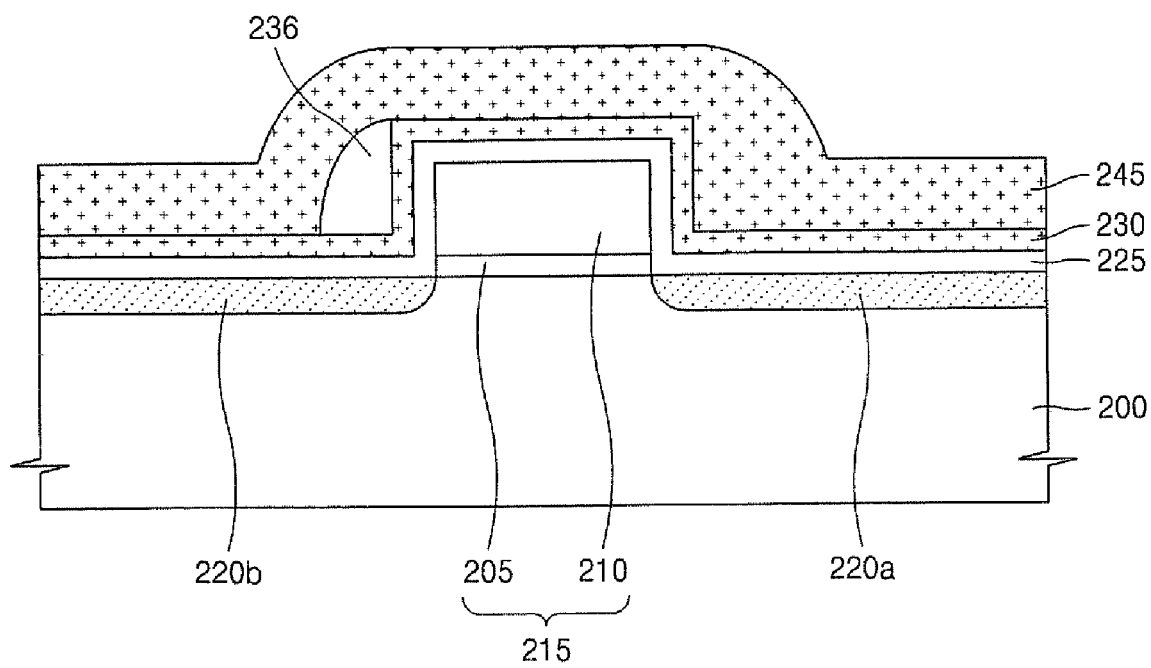

Referring to FIG. 8D, the photoresist pattern 240 is removed and a second layer 245 is deposited on the resultant structure to the same thickness as the first layer 235, for example, to a thickness of about 500 Å to about 1500 Å. The second layer 245 may include, for example, a silicon nitride layer and/or an undoped polysilicon layer, which has a higher dielectric constant than the first layer 235.

Figure 8E:
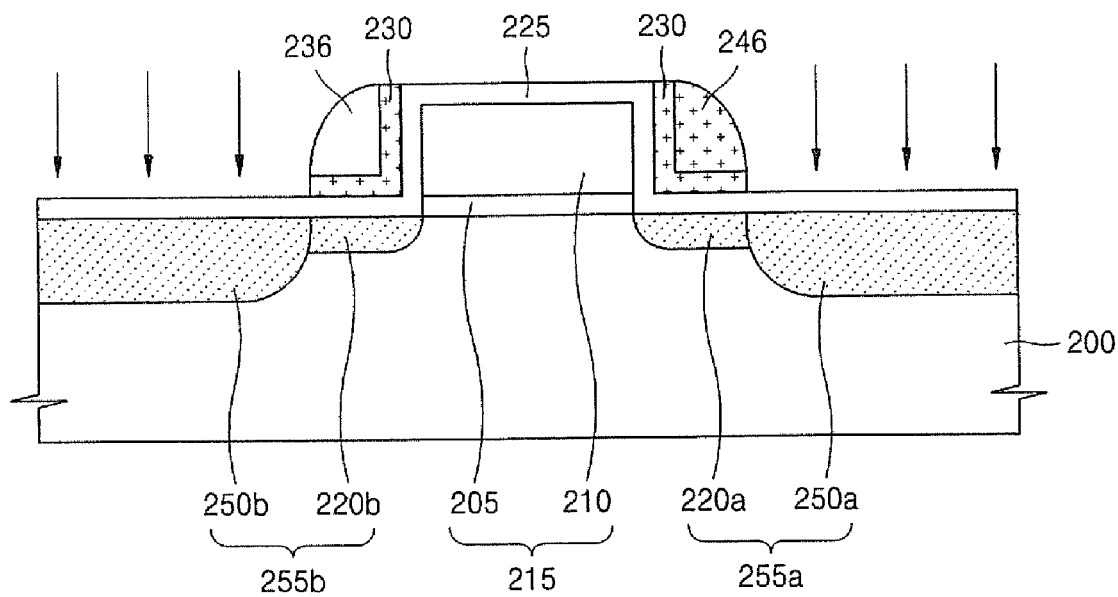

Referring to FIG. 8E, an anisotropic etching process is preformed on the second layer 245 to expose the etch stopper 232 on the word line gate structure 215, preferably the silicon oxide layer 225 of the etch stopper 232, and to form a second spacer 246. The second spacer 246 is formed on the sidewall of the word line gate structure 215 where the previously formed spacer was removed. In this manner, the spacers 236 and 246 having different dielectric constants are formed on respective sidewalls of the word line gate structure 215.

Impurity ions are implanted at high concentration into the semiconductor substrate 200 on respective sides of the word line gate structure 215, such that high-concentration impurity regions 250a and 250b are formed. Accordingly, an MOS transistor with LDD-type source and drain regions 255a and 255b is formed.

Referring again to FIG. 7, an interlayer insulating layer 260 is deposited on the semiconductor substrate 200 where the MOS transistor is formed. The interlayer insulating layer 260 is etched to form contact holes that expose the source and drain regions 255a and 255b. A conductive layer is deposited on the interlayer insulating layer 260, filling the contact holes. The conductive layer is then patterned to form first and second contact plugs 265a and 265b. The second contact plug 265b is a bit line contact plug.

In the embodiments of FIG. 7, the etch stopper formed between each spacer 236 and 246 and the word line gate structure 215 can prevent a loss of the gate oxide layer 205 and damage to the semiconductor substrate 200 during removal of the first spacer 236 and formation of the second spacer 246.

In addition, like the first-described embodiments, the sidewall spacer adjacent to the bit line contact plug has a relatively lower dielectric constant than the spacer formed on the other sidewall. Accordingly, a parasitic capacitance between the bit line and the word line can be decreased such that bit line loading capacitance can be reduced.

As the semiconductor device is more highly integrated, a margin for forming a contact hole on an active region may be reduced. Therefore, according to further embodiments of the present invention, a borderless contact structure may be formed in which a contact hole is formed over both an active region and a device isolation region. This process can allow the size of the contact to be maintained while maintaining a distance between the gate electrode of the transistor and the contact.

Figure 9:
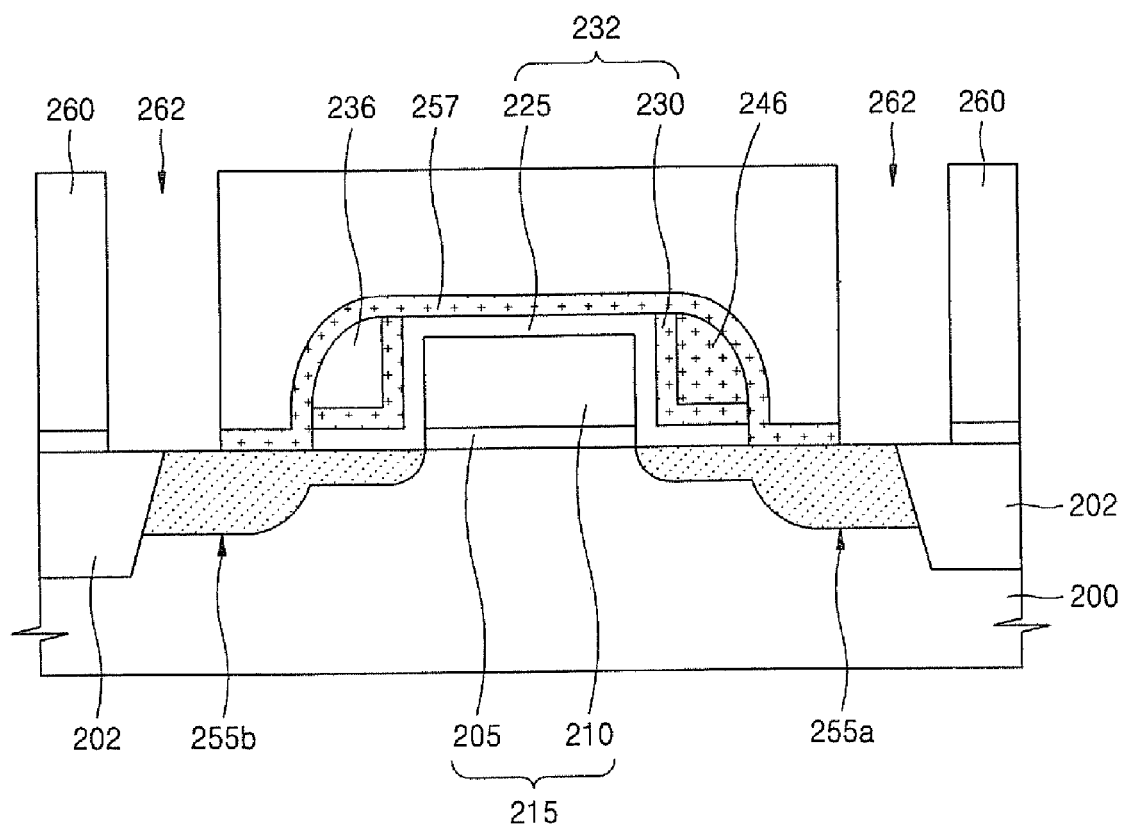
FIG. 9 is a cross-sectional view of a memory device according to additional embodiments of the present invention.

In order to form such a borderless contact according to some embodiments of the present invention, as shown in FIG. 9, source and drain regions 255a and 255b may be formed as shown in FIG. 8E and the resultant structure covered with an etch stopper 257 for forming a borderless contact. The etch stopper 257 may include a silicon nitride layer. An interlayer insulating layer 260 is formed on the etch stopper 257. The interlayer insulating layer 260 and etch stopper 257 are etched to form borderless contact holes 262 that expose the source and drain regions 255a and 255b and adjacent portions of a device isolation layer 202. Contact plugs may be formed in the holes 262 using well-known techniques.

Figure 10:
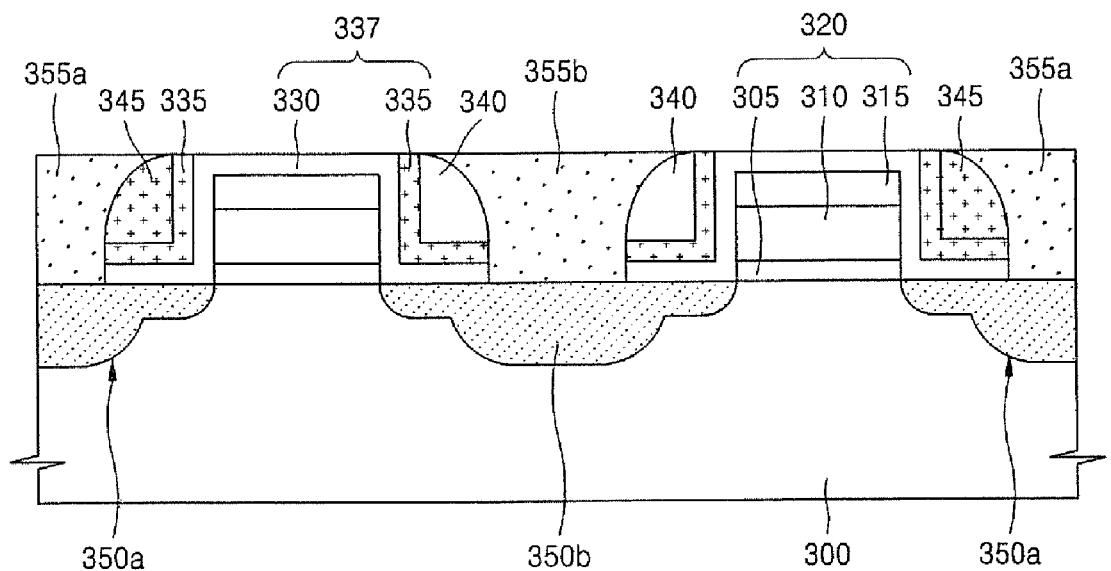
FIG. 10 is a cross-sectional view of a DRAM according to further embodiments of the present invention.

FIG. 10 is a cross-sectional view of a DRAM according to further embodiments of the present invention. Referring to FIG. 10, a word line gate structure 320 is formed on a semiconductor substrate 300. The word line gate structure 320 includes a gate oxide layer 305, a conductive layer 310 and a hard mask layer 315. In case of the DRAM, two such word line gate structures are formed on one active region. Source and drain regions 350a and 350b are formed on the semiconductor substrate 300 on respective sides of the word line gate structures 320. The source region 350a may be formed on outer sides of the word line gate structures 320 and the drain region 350b may be formed between the word line gate structures.

First spacers 340 are formed on sidewalls of the word line gate structures 320 overlying the drain region 350b, and second spacers 345 are formed on sidewalls of the word line gate structures 320 overlying the source regions 350a. The first spacers 340 include an insulating layer having a relatively lower dielectric constant than the second spacers 345. The first and second spacers 340 and 345 are symmetrical in shape, with substantially the same thickness. For example, the first spacer 340 may include a silicon oxide layer and the second spacer 345 may include a silicon nitride layer and/or an undoped polysilicon layer.

An etch stopper 337 may be interposed between each spacer 340 and 345 and the word line gate structures 320. The etch stopper 337 may include a stacked combination of a silicon oxide layer 330 and a silicon nitride layer 335. The silicon oxide layer 330 is formed between each spacer 340 and 345 and the semiconductor substrate 300, between each spacer 340 and 345 and the word line gate structures 320, and/or on the word line gate structures 320. The silicon nitride layer 335 is formed between each spacer 340 and 345 and the semiconductor substrate and between each spacer 340 and 345 and the word line gate structure 320. As described above, the etch stopper 337 can protect the gate oxide layer 305 and the semiconductor substrate 300.

An interlayer insulating layer may be formed on the resultant structure and contact holes formed to expose the source and drain regions 350a and 350b. A conductive material is deposited to fill the contact holes to thereby form first and second contact plugs 355a and 355b. The first contact plug 355a contacts the source region 350a and can be electrically connected to a subsequently formed storage node electrode (not shown). The second contact plug 355b contacts the drain region 350b and can be electrically connected to a subsequently formed bit line. The contact plugs 355a and 355b can be formed using an etch-back process or a chemical mechanical polishing process.

In the DRAM described above, the second spacer 345 has a relatively high dielectric constant and is interposed between the first contact plug 355a, which will be contacted with the storage node electrode, and the word line gate structure 320. Therefore, a capacitance between the first contact plug 355a and the word line gate structure 320 can be increased such that a data storage capacitance is increased. As a result, cell stability can be increased. The first spacer 340 has a relatively low dielectric constant and is interposed between the second contact plug, 355b, which will be contacted with the bit line, and the word line gate structure 320. Therefore a capacitance between the second contact plug 355b and the word line gate structure 320 can be lower than the capacitance between the first contact plug 355a and the word line gate structure 320, such that a bit line loading capacitance can be reduced. As a result, a faster operating speed can be obtained.

Figure 2:
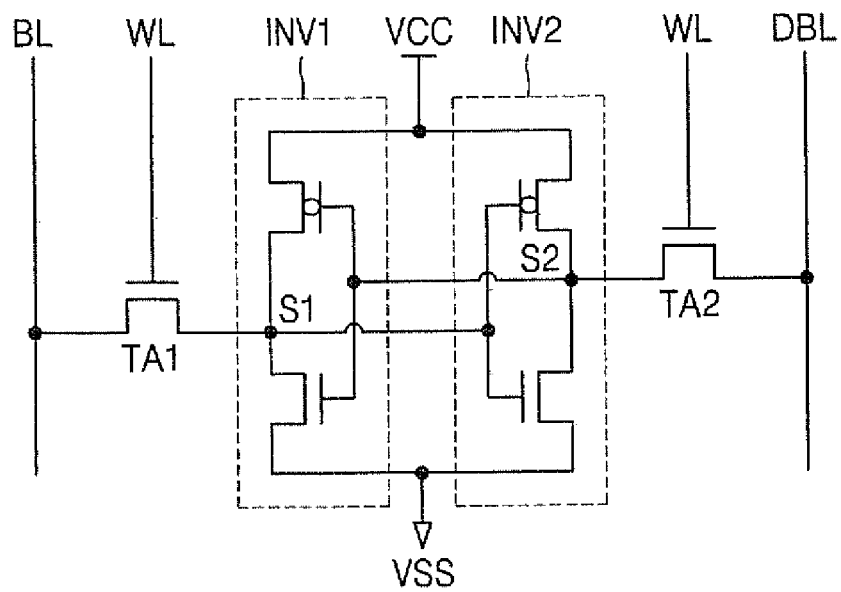
FIG. 2 is a schematic circuit diagram showing a unit cell of a conventional SRAM.
Figure 3:
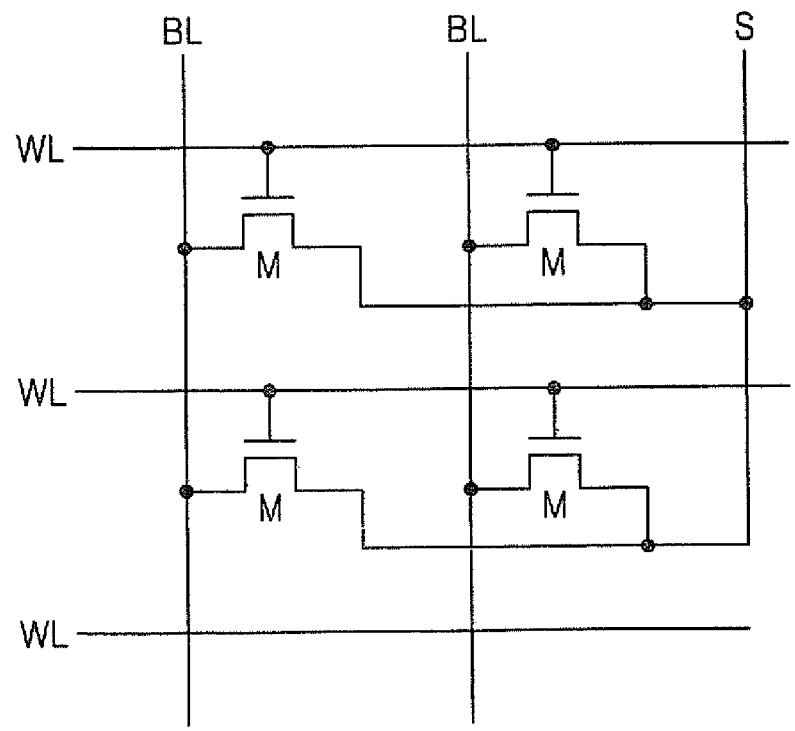
FIG. 3 is a schematic circuit diagram of a conventional non-volatile memory device.
Figure 4:
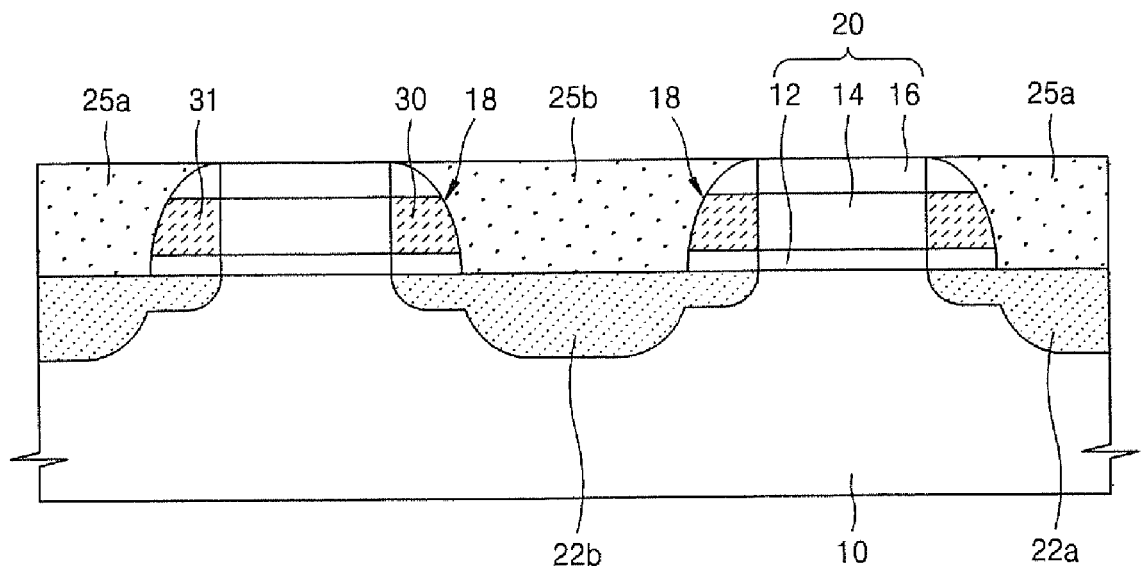
FIG. 4 is a cross-sectional view of a conventional DRAM.
Figure 11:
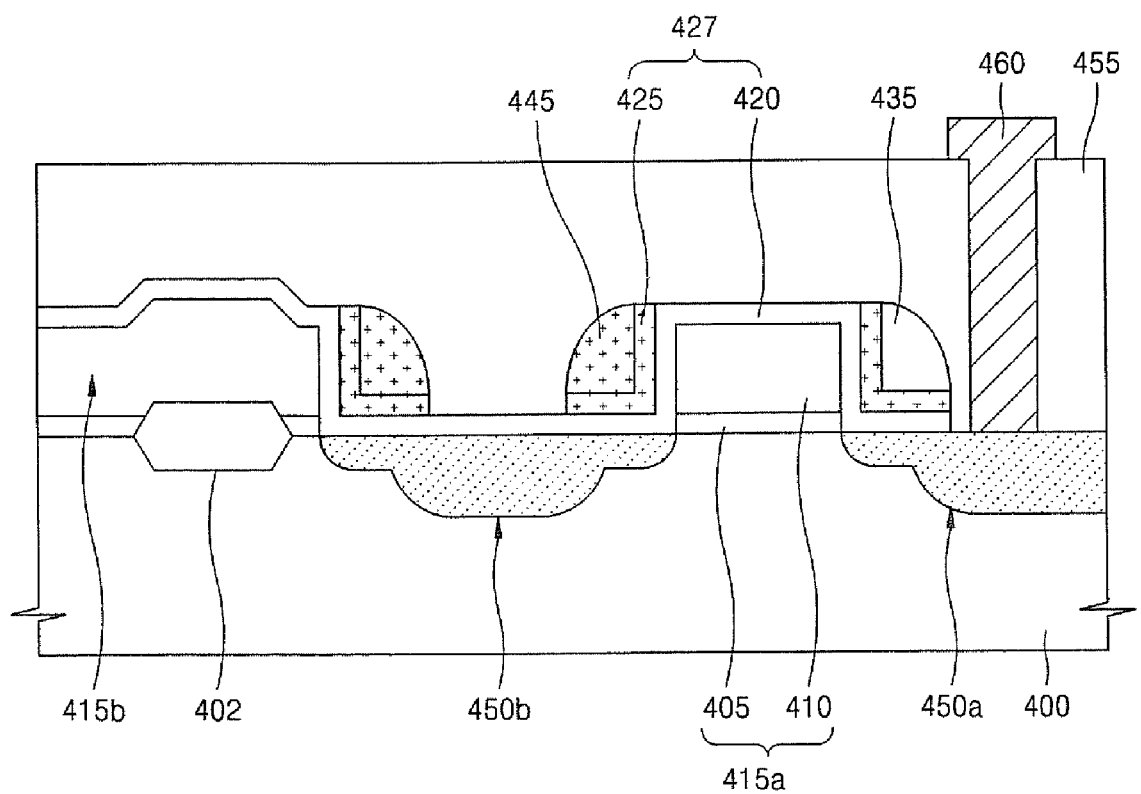
FIG. 11 is a cross-sectional view of an SRAM according to additional embodiments of the present invention.

FIG. 11 is a cross-sectional diagram illustrating an SRAM according to additional embodiments of the present invention. Referring to FIG. 11, gate structures 415a and 415b, each including a gate oxide layer 405 and a conductive layer 310, are formed on a semiconductor substrate 400 where a device isolation layer 402 is formed. The gate structures 415a and 415b may be, respectively, a gate structure for an access transistor and a gate structure for a drive transistor for an SRAM circuit along the lines shown in FIG. 2.

Source and drain regions 450a and 450b are formed on the semiconductor substrate 400 on respective sides of the gate structures 415a and 415b. The source region 450a is formed on an outer side of the gate structure 415a for the access transistor and the drain region 450b is formed between the gate structures 415a and 415b, so that the access transistor and the drive transistor can share the drain region 450b. In addition, the drain region 450b can serve as a charge storage node.

A first spacer 435 is formed on a sidewall of the gate structure 415a disposed on the source region 450a. A second spacer 445 is formed on the common drain region 450b of the gate structures 415a and 415b for the access transistor and the drive transistor. The first spacer 435 may include a layer having a relatively lower dielectric constant than the second spacer 445. For example, the first spacer 435 may include a silicon oxide layer and the second spacer 445 may include a silicon nitride layer and/or an undoped polysilicon layer. The first and second spacers 435 and 445 are symmetrical in shape, with substantially the same thickness. Although not shown in the drawing, a spacer formed in the source region of the drive transistor is not adjacent to the external signal line. Therefore, the spacer can be formed of the same material as the second spacer.

An etch stopper 427 can be interposed between each spacer 435 and 445 and the gate structures 415a and 415b. The etch stopper 427 may be a stacked combination of a silicon oxide layer 420 and a silicon nitride layer 425. As described above, the silicon oxide layer may be formed between each spacer 435 and 445 and the semiconductor substrate 400, between each spacer 435 and 445 and the gate structures 415a and 415b, and on the gate structures 415a and 415b. The nitride layer 425 is formed between each spacer 435 and 445 and the semiconductor substrate 400, and between each spacer 435 and 445 and the gate structures 415a and 415b. The etch stopper 427 can protect the gate oxide layer 405 and the semiconductor substrate 400. An interlayer insulating layer 455 is formed on the resultant structure and a contact hole is formed to expose the source region 450a of the access transistor. A bit line 460 is formed to contact the exposed source region 450a. The spacers of these embodiments can be formed using the same methods described for the afore-described embodiments.

In an SRAM constructed as above, the spacer formed on the source region of the access transistor adjacent to the bit line 460 is formed of a material having a relatively low dielectric constant. Therefore, it is possible to decrease a parasitic capacitance (a bit line loading capacitance) between the bit line 460 and the gate structure 415a of the access transistor. The spacer formed on the access transistor's drain region acting as a charge storage node is formed of a material having a relatively high dielectric constant, such that a data storage capacitance of the SRAM can be increased.

Figure 12:
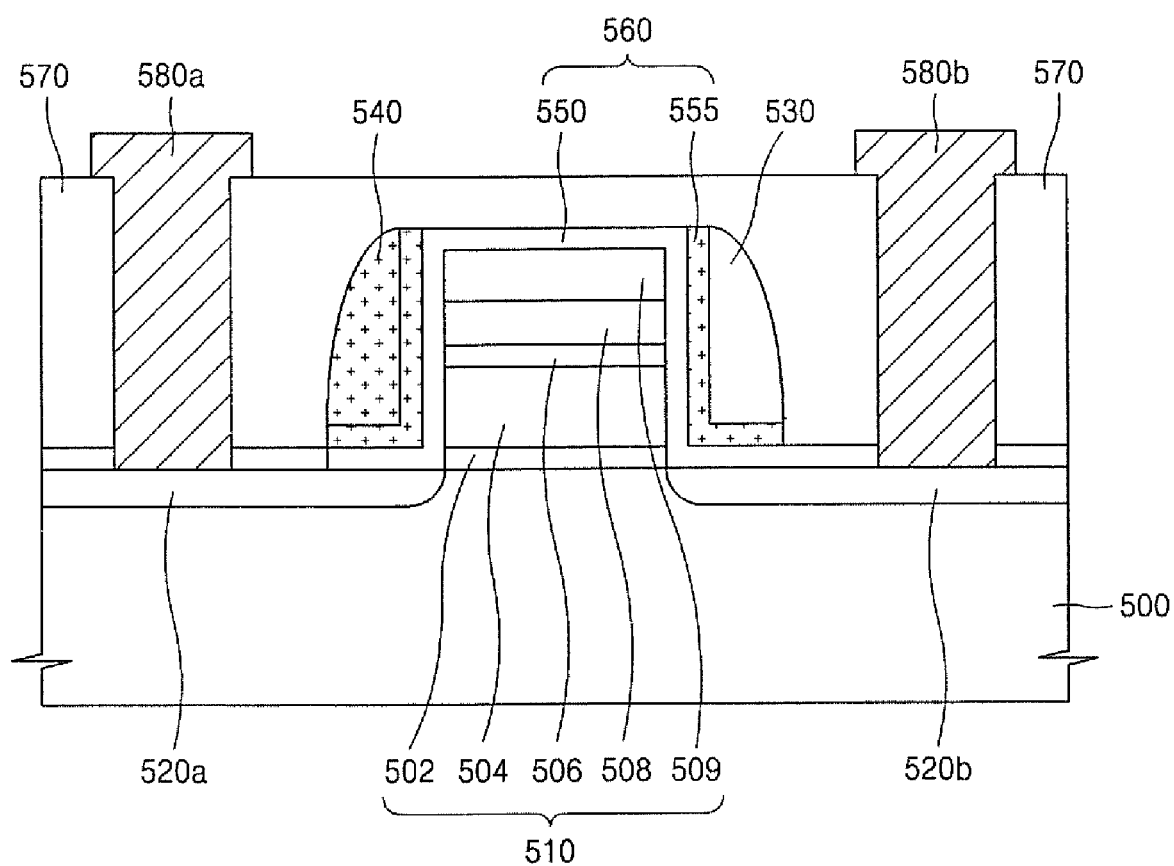
FIG. 12 is a cross-sectional view of a non-volatile memory device according to still further embodiments of the present invention.

FIG. 12 is a cross-sectional view illustrating a non-volatile memory device according to still further embodiments of the present invention. Referring to FIG. 12, a gate structure is formed on a semiconductor substrate 500. The gate structure 510 includes a stacked combination of a tunnel oxide layer 502, a floating gate 504, an inter-gate dielectric layer 506, a control gate 408 and a silicide layer 509. The tunnel oxide layer 502 may be a thermal oxide thin film, and the floating gate 504 and the control gate 508 may be doped polysilicon layers. For example, the inter-gate dielectric layer 506 may be an oxide-nitride-oxide (ONO) layer.

Source and drain regions 520a and 520b are formed on respective sides of the gate structure 510. A first spacer 530 is formed on a sidewall of the gate structure 510 disposed on the drain region 520b and a second spacer 540 is formed on a sidewall of the gate structure 510 disposed on the source region 520a. The first spacer 530 may be an insulating layer, for example, a silicon oxide layer, which has a lower dielectric constant than the second spacer 540. The second spacer 540 may be, for example, a silicon nitride layer and/or an undoped polysilicon layer.

An etch stopper can be interposed between each spacer 530 and 540 and the gate structure 510. The etch stopper 560 may be a stacked combination of a silicon oxide layer 550 and a silicon nitride layer 555. The silicon oxide layer 550 may be disposed between each spacer 530 and 540 and the semiconductor substrate 500, between each spacer 530 and 540 and the gate structure 510, and on the gate structure 510. The silicon nitride layer 555 is disposed between each spacer 530 and 540 and the semiconductor substrate 500, and between each spacer 530 and 540 and the gate structure 510. The etch stopper 560 can protect the tunnel oxide layer 502 and the semiconductor substrate 500.

An interlayer insulating layer 570 is formed on the resultant structure. The interlayer insulating layer 570 is etched to form contact holes that expose the source and drain regions 520a and 520b. A source electrode line 580a is formed in contact with the exposed source region 520a and a bit line 580b is formed in contact with the exposed drain region 520b. The spacers of these embodiments can also be formed using the same methods of the afore-described embodiments.

In the non-volatile memory device constructed as above, the first spacer 530 adjacent to the bit line 580b is formed of a material having a relatively low dielectric constant. Therefore, a parasitic capacitance between the bit line 580b and the gate structure 510 can be decreased. The spacer adjacent to the external signal line (the bit line) is formed of a layer having a relatively low dielectric constant. Accordingly, the parasitic capacitance between the bit line and the word line (the gate electrode) can be decreased and the operating speed of the semiconductor memory device can be improved. In addition, the spacer adjacent to the storage node electrode is formed of a layer having a relatively high dielectric constant. Accordingly, the data storage capacitance can be increased, such that the cell stability can be improved.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A method of fabricating a memory device, the method comprising:
    forming a gate electrode on a substrate;
    forming first and second sidewall spacers on first and second sidewalls of the gate electrode, the first and second sidewall spacers having different dielectric properties;
    forming source and drain regions in the substrate adjacent the respective first and second sidewalls of the gate electrode; and
    forming a bit line contact plug on the drain region,
    wherein the second sidewall spacer has a lower dielectric constant than the first sidewall spacer.

2. A method according to claim 1, further comprising forming charge storage node electrode on the source region.

3. A method according to claim 1, wherein the first sidewall spacer comprises silicon nitride and/or undoped polysilicon, and wherein the second sidewall spacer comprises silicon oxide.

4. A method according to claim 1, further comprising forming an etch stopper on the first and second sidewalls of the gate electrode before forming the first and second sidewall spacers.

5. A method according to claim 1, wherein the first and second sidewall spacers are substantially symmetrical and/or have substantially the same thickness.

6. A method of fabricating a memory device, the method comprising:
    forming a word line gate structure on a semiconductor substrate;
    forming first spacers on respective sidewalls of the word line gate structure;
    removing one of the first spacers from one of the sidewalls;
    forming a second spacer on the one of the sidewalls from which the first spacer was removed, the second spacer having a different dielectric constant than the first spacer;
    forming source and drain regions in the substrate adjacent respective sidewalls of the word line gate structure; and
    forming a bit line contact plug on the drain region;
    wherein the drain region is formed adjacent the remaining first spacer, and wherein the first spacer has a lower dielectric constant than the second spacer.

7. A method according to claim 6, wherein the first spacers comprise silicon oxide and wherein the second spacer comprises silicon nitride and/or undoped polysilicon.

8. A method according to claim 6, wherein the first and second spacers are substantially symmetrical and/or have substantially the same thickness.

9. A method according to claim 6 wherein the source region is formed adjacent the second spacer, and wherein the method further comprises forming a storage node contact plug on the source region.

10. A method according to claim 6, further comprising:
forming an interlayer insulating layer on the substrate;
removing portions of the interlayer insulating layer to form respective contact holes that expose the source and drain regions; and
forming conductive plugs in the contact holes that contact respective ones of the source and drain regions.

11. A method of fabricating a memory device, the method comprising:
forming a word line gate structure on a semiconductor substrate; forming an etch stopper on the semiconductor substrate and on the word line gate structure;
forming first spacers on respective first and second sidewalls of the word line gate structure;
selectively removing one of the first spacers from one of the sidewalls;
forming a second spacer on the one of the sidewalls from which the first spacer was removed, the second spacer having a different dielectric constant than the first spacer;
forming source and drain regions in the substrate adjacent the respective first and second spacers;
forming an interlayer insulating layer on the semiconductor substrate; and
forming a bit line contact plug extending through the interlayer insulating layer to contact one of the source region or the drain region,
wherein the one of the source or drain region is formed adjacent the remaining first spacer, and
wherein the first spacer has a lower dielectric constant than the second spacer.

12. A method according to claim 11, wherein the step of forming an etch stopper comprises:
forming a silicon oxide layer on the semiconductor substrate and on the word line; and
forming a silicon nitride layer on the silicon oxide layer.

13. A method according to claim 12, wherein forming a second spacer comprises:
depositing a silicon nitride layer and/or an undoped polysilicon layer on the semiconductor substrate; and
anisotropically etching the silicon nitride layer and/or the undoped polysilicon layer to expose the silicon oxide layer of the etch stopper formed on the word line.

14. A method according to claim 13, wherein the silicon oxide layer and the silicon nitride layer are formed 100 Å to 300 Å thick.

15. A method according to claim 11, wherein forming first spacers comprises:
depositing a silicon oxide layer on the etch stopper; and
anisotropically etching the silicon oxide layer to expose the etch stopper and form the first spacers.

16. A method according to claim 11, wherein removing one of the first spacers comprises:
forming a photoresist pattern to cover a first one of the first spacers and to leave a second one of the first spacers exposed;
removing the exposed first spacer using a wet etching process; and
removing the photoresist pattern.

17. A method according to claim 11, wherein the first and second spacers have substantially the same thickness.

* * * * *